US 6,718,604 B1

(12) United States Patent
Taga et al.

(10) Patent No.: US 6,718,604 B1
(45) Date of Patent: Apr. 13, 2004

(54) MOUNTING METHOD FOR ELECTRONIC DEVICE ELEMENTS

(75) Inventors: Shigeto Taga, Kanazawa (JP); Kazunobu Shimoe, Kanazawa (JP); Ryoichi Kita, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 209 days.

(21) Appl. No.: 09/596,355

(22) Filed: Jun. 17, 2000

(30) Foreign Application Priority Data

Jun. 22, 1999 (JP) .......................... 11-175718
Nov. 2, 1999 (JP) .......................... 11-312505

(51) Int. Cl.⁷ ............................................. H04R 17/00
(52) U.S. Cl. ........................ 29/25.35; 29/832; 29/840; 29/740; 29/743
(58) Field of Search ..................... 29/832, 840, 740, 29/743; 228/110.1, 173.2, 180.22; 294/64.1

(56) References Cited

U.S. PATENT DOCUMENTS

| | | | | |
|---|---|---|---|---|
| 3,486,223 A | * | 12/1969 | Butra | 29/626 |
| 5,074,947 A | * | 12/1991 | Estes et al. | 29/832 |
| 5,384,952 A | * | 1/1995 | Matsui | 29/840 |
| 5,471,722 A | * | 12/1995 | Yatsuda | 29/840 |
| 5,477,419 A | * | 12/1995 | Goodman et al. | 29/840 |
| 5,699,027 A | * | 12/1997 | Tsuji et al. | 310/313 R |
| 5,843,251 A | * | 12/1998 | Tsukagoshi et al. | 29/832 |
| 6,101,708 A | * | 8/2000 | Okano et al. | 29/832 |
| 6,189,208 B1 | * | 2/2001 | Estes et al. | 29/840 |

FOREIGN PATENT DOCUMENTS

| JP | 63-25939 | 2/1988 | | |
|---|---|---|---|---|
| JP | 2-86135 | 7/1990 | | |
| JP | 08-139138 | 5/1996 | | |
| JP | 08-330880 | 12/1996 | | |
| JP | 10-107078 | * | 4/1998 | ........... H01L/21/60 |
| JP | 11-122072 | 4/1999 | | |

* cited by examiner

Primary Examiner—A. Dexter Tugbang
Assistant Examiner—Tai Nguyen
(74) Attorney, Agent, or Firm—Keating & Bennett, LLP

(57) ABSTRACT

A mounting method for an electronic device element, includes the steps of providing an electronic device element having metal bumps formed on a surface thereof, providing a bonding tool having a pressing surface, providing a mounting substrate, keeping the pressing surface of the bonding tool in contact with a reverse surface of the electronic device element and applying an ultrasonic wave to the bonding tool, thereby mounting the electronic device element on the mounting substrate. The maximum length of the pressing surface of the bonding tool in the ultrasonic-wave-oscillation direction is greater than about 0.5 times the maximum length of the reverse surface of the electronic device element in the ultrasonic-wave-oscillation direction.

18 Claims, 9 Drawing Sheets

ULTRASONIC-WAVE-
OSCILLATION DIRECTION

ULTRASONIC-WAVE-
OSCILLATION DIRECTION (MAXIMUM LENGTH OF PRESSING FACE OF BONDING TOOL
IN ULTRASONIC-WAVE-OSCILLATION DIRECTION)/
(MAXIMUM LENGTH OF SURFACE ACOUSTIC WAVE DEVICE
IN ULTRASONIC-WAVE-OSCILLATION DIRECTION)

MOUNTING METHOD FOR ELECTRONIC DEVICE ELEMENTS

BACKGROUND OF THE INVENTION

1. Field of the Invention

The present invention relates to a method for mounting electronic device elements, and more particularly, the present invention relates to a method for mounting surface acoustic wave devices on mounting substrates by applying an ultrasonic wave thereto and pressing surface acoustic wave devices on the mounting substrates.

2. Description of the Related Art

Corresponding to recent miniaturized and thin electronic components, a flip chip bonding method has been developed as a method of mounting electronic device elements on substrates. The flip chip bonding method is a mounting method that positions a functional surface of an electronic device element relative to a substrate such that the functional surface opposes the substrate, then affixes the electronic device element thereon. The method is used to electrically and mechanically connect metal bumps formed on electrodes of an electronic device element and electrode patterns on the substrate. Further, the method is used to connect metal bumps located on electrode patterns provided on a substrate to electrodes of an electronic device element. Flip chip bonding methods currently in use include a method that applies an ultrasonic wave at the time of connection, and a method that simultaneously applies an ultrasonic wave and heat at the time of connection. These methods are used to increase the strength of the connections between the metal bumps and the electrode patterns provided on the mounting substrate.

In the flip chip bonding method that uses only the ultrasonic wave, increasing the ultrasonic wave power that is applied increases the strength of the connections between the metal bumps and the electrode patterns provided on the mounting substrate. However, when an ultrasonic wave power is excessively increased, a great deal of stress is exerted on the electrodes on the element and the substrate that defines the element, thereby causing cracks in the electrodes and the substrate.

Japanese Unexamined Patent Application Publication No. 8-330880 discloses a method as shown in FIGS. 14A and 14B that causes the above-mentioned problems. More specifically, as shown in FIG. 14A, although the direction of a load exerted by a bonding tool 67 is perpendicular to an electrode surface of an electronic device element 61, the ultrasonic-wave-oscillation direction is horizontal. Therefore, a resultant force of the load and the ultrasonic wave, as shown in FIG. 14B, is exerted onto the electronic device element 61. As a result, the level of a side portion of the electronic device element 61 is significantly lower than the level of the central portion. Accordingly, energy is concentrated on a metal bump 64 positioned on a side portion of the electronic device element, and the metal bump 64 collapses more than a metal bump 65 located in the central portion, thereby causing cracks in the metal bump 64 and an electrode pad 62.

To solve the aforementioned problems, Japanese Unexamined Patent Application Publication No. 8-330880 suggests that dummy bumps be provided on the electronic device element. Specifically, as shown in FIG. 15, dummy pads 73 and dummy bumps 74 are provided farther away from the central portion in the ultrasonic-wave-oscillation direction than electrode pads 72 and metal bumps 75 provided on an electronic device element 71, thereby allowing stress to be concentrated on the dummy pads 73 and the dummy bumps 74. This prevents the cracks from forming on the electrode pads 72 and the metal bumps 75 that provide the necessary electrical conduction to a mounting substrate provided on the element 71.

However, the method wherein the dummy bumps are provided for preventing the aforementioned cracks from forming is plagued by the following problems. According to the above-described method, since the dummy pads and the dummy bumps must be additionally provided, the size of the substrate of the electronic device element must be increased. This causes a problem in that the size of the overall electronic component is increased. Further, when cracks occur in the dummy pads, pieces of pads may be separated from the dummy pads. If the pieces adhere to the surface of the electronic device element, electrical characteristics of the electronic component and the reliability thereof deteriorate.

SUMMARY OF THE INVENTION

To overcome the problems described above, preferred embodiments of the present invention provide a method of mounting electronic device elements for producing small electronic components that have a high reliability in coupling between an electronic device element and a package and excellent electrical characteristics.

A preferred embodiment of the present invention includes the steps of providing an electronic device element having metal bumps provided on a surface thereof, providing a bonding tool having a pressing surface, providing a mounting substrate, keeping the pressing surface of the bonding tool in contact with a reverse surface of the electronic device element, and applying an ultrasonic wave to the bonding tool, thereby mounting the electronic device element on the mounting substrate, wherein the maximum length of the pressing surface of the bonding tool in the ultrasonic-wave-oscillation direction is greater than approximately half the maximum length of the reverse surface of the electronic device element in the ultrasonic-wave-oscillation direction.

In this way, by increasing the length of the pressing surface of the boding tool in the ultrasonic-wave direction, the length of a surface wave acoustic wave device in the oscillation direction in contact with the bonding tool is increased. Thus, at the time of packaging, even when a resultant force of the load and the ultrasonic wave is momentarily exerted in a tilted orientation, the surface acoustic wave device is not tilted with respect to the horizontal direction of the mounting substrate nor does stress concentrate on metal bumps in specific positions in the electronic device element. Therefore, occurrence of cracks in the metal bumps and electrode pads is greatly reduced, thereby providing stable and reliable coupling with excellent electrical characteristics between the electronic device element and the mounting substrate.

Another preferred embodiment of the present invention provides that the shape of the pressing surface of the bonding tool is substantially the same as the shape of the reverse surface of the electronic device element. In this way, by selecting the shape of the pressing surface of the bonding tool to be substantially the same as the shape of the reverse surface of the electronic device element, the length of the electronic device element in contact with the bonding tool is further increased in directions other than the ultrasonic-wave-oscillation direction. That is, the element has a large area in contact with the boding tool such that stable contact is provided. As a result, stress is not concentrated on metal bumps in specific positions in the element. As a result, occurrence of cracks on metal bumps and electrode pads is greatly reduced, thereby further improving the coupling of the electronic device element to the substrate.

Further, in another preferred embodiment of the present invention, the maximum length of the pressing surface of the bonding tool in the ultrasonic-wave-oscillation direction is substantially equal to or less than the maximum length of the reverse surface of the electronic device element in the ultrasonic-wave-oscillation direction.

By arranging the maximum length of the pressing surface of the bonding tool in the ultrasonic-wave-oscillation direction to be substantially equal to or less than the maximum length of the reverse surface of the electronic device element in the ultrasonic-wave-oscillation direction, when the electronic device element is packaged in the package, interference with sidewalls of the package when the ultrasonic wave is applied is prevented without increasing the size of the package as compared to the size of the electronic device element. Therefore, miniaturization of electronic components is achieved.

By arranging the maximum length of the pressing surface of the bonding tool in the ultrasonic-wave-oscillation direction is considerably less than the length of the reverse face of the electronic device element in the ultrasonic-wave-oscillation direction, even when the pressing surface of the bonding tool deviates from the reverse surface of the electronic device element, there is a small distance between the periphery of the pressing surface of the bonding tool and the periphery of the reverse surface of the element. Therefore, the interference caused by the bonding tool and the package is prevented.

Another preferred embodiment of the present invention provides that the maximum length of the pressing surface of the bonding tool in the ultrasonic-wave-oscillation direction is approximately 0.8 times the maximum length of the reverse surface of the electronic device element in the ultrasonic-wave-oscillation direction.

The length of the pressing surface of the bonding tool in the ultrasonic-wave-oscillation direction is preferably such that the electronic device element does not substantially tilt with respect to the horizontal direction of the mounting substrate. In addition, the length is also preferably arranged to prevent between the sidewall of the package and the bonding tool even when the pressing surface of the bonding tool somewhat deviates from the reverse surface of the electronic device element. To satisfy these conditions, the maximum length of the pressing surface of the bonding tool in the ultrasonic-wave-oscillation direction is set to be approximately 0.8 times the maximum length of the reverse surface of the electronic device element in the ultrasonic-wave-oscillation direction.

Another preferred embodiment of the present invention provides that a vacuum opening for securing the electronic device element is provided on the pressing surface of the aforementioned bonding tool. The vacuum opening is positioned at a portion of a reverse surface of the electronic device element where bumps are not located, such that very stable and reliable mounting of the electronic device element on the mounting substrate is achieved.

Thus, by providing the bonding tool with the vacuum opening to enable the bonding tool to pick up the electronic device element and to position the electronic device on the mounting substrate, the ultrasonic wave power which is applied to portions of the electronic device element positioned directly under the vacuuming opening is reduced with respect to a power that is exerted on a portion of the electronic device element which is in direct contact with the bonding tool. Therefore, by providing the vacuuming opening in positions on the reverse surface of a portion where the metal bump of the electronic device element is not located, the ultrasonic wave power which is exerted on individual metal bumps is uniform. In this case, stress is not concentrated on metal bumps on specific positions. Therefore, occurrence of cracks in the metal bumps and a metal bump is greatly reduced, thereby providing stable and very reliable coupling of the electronic device element to the substrate.

Another preferred embodiment of the present invention provides that the aforementioned electronic device element is a surface acoustic wave device. In a surface acoustic wave device, since a space must be provided on the side of a functional surface of the device to allow surface waves to be generated and propagated freely, the device cannot be immobilized by providing an adhesive between the device and a package. Therefore, metal bumps must be used to electrically and mechanically couple the device and the package together. The metal bumps are arranged to provide a high coupling strength and reliability.

Another preferred embodiment of the present invention provides a method of manufacturing a surface acoustic wave unit including using the mounting method of the above preferred embodiments to incorporate a surface acoustic wave device into a package, and closing the package by fixing a cap to the package. The method of mounting the electronic device elements according to preferred embodiments of the present invention can be used to package the surface acoustic wave device. That is, the mounting method may be applied to methods of manufacturing of surface acoustic wave devices.

Other features, elements, characteristics and advantages of the present invention will become more apparent with reference to preferred embodiments thereof which are described in detail below with reference to the attached drawings.

DETAILED DESCRIPTION OF PREFERRED EMBODIMENTS

Hereinafter, preferred embodiments of the present invention are explained in detail with reference to the drawings.

Figure 1:
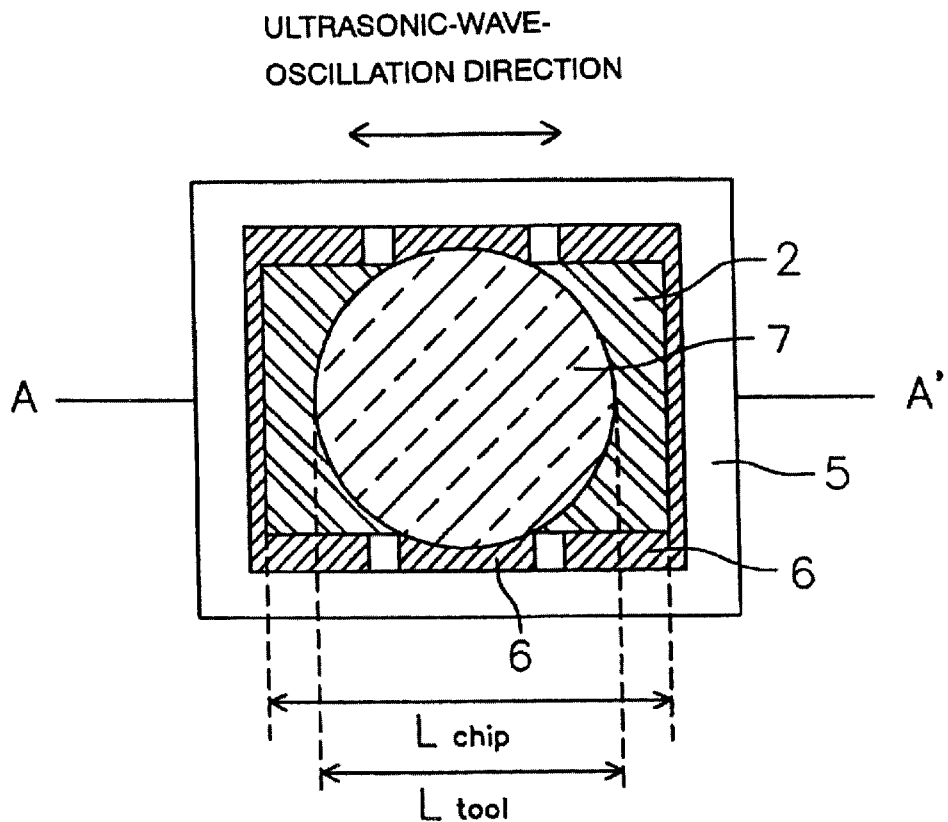
FIG. 1 is a top view of a method according to a first preferred embodiment of the present invention used to package a surface acoustic wave device.
Figure 2:
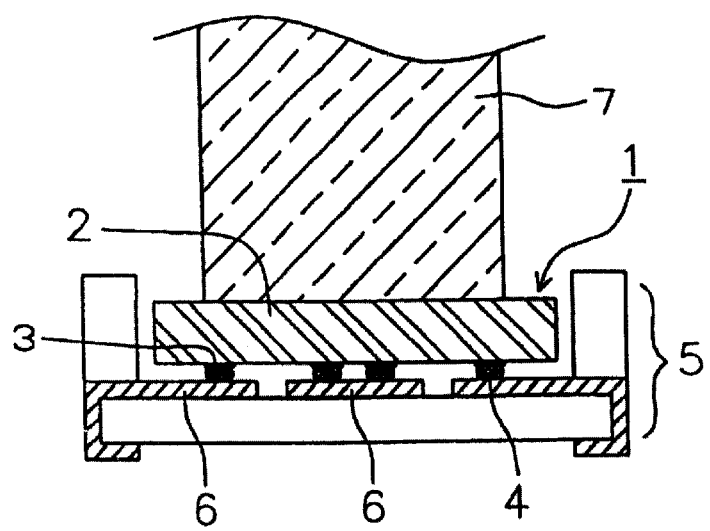
FIG. 2 is a cross-sectional view along line A–A' of FIG. 1.
Figure 3:
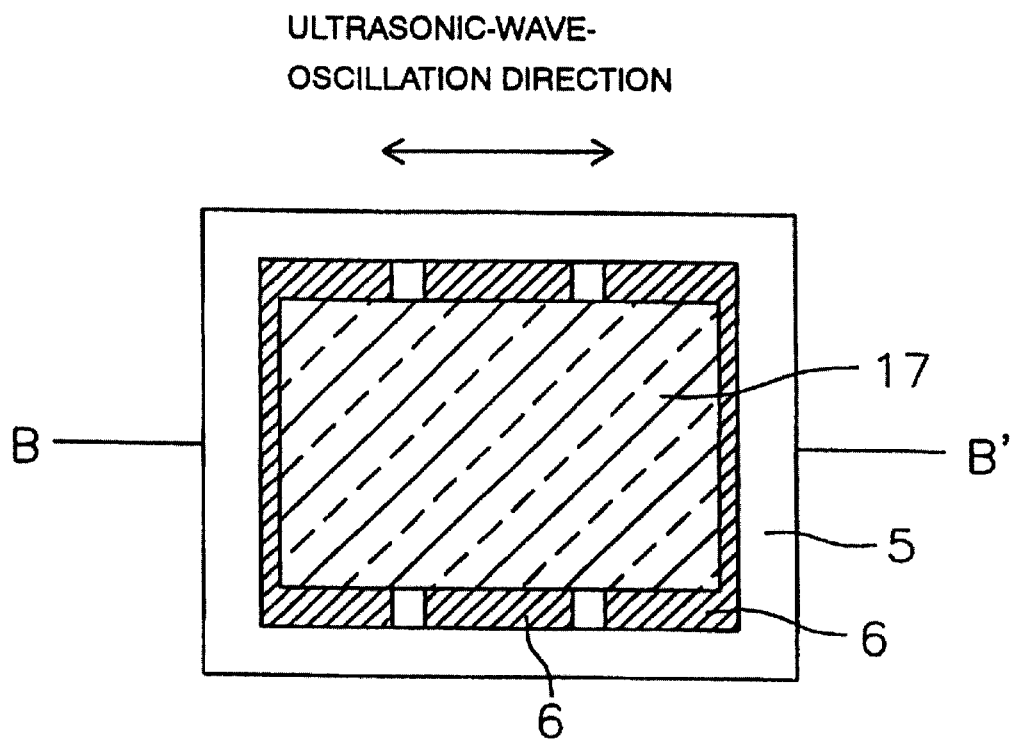
FIG. 3 is a top view of a method according to a second preferred embodiment of the present invention used to package a surface acoustic wave device.
Figure 4:
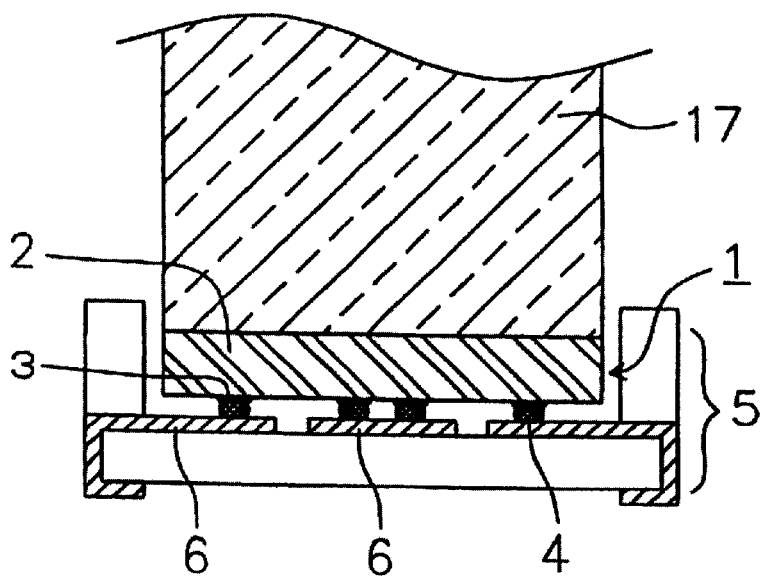
FIG. 4 is a cross-sectional view along line B–B' of FIG. 3.
Figure 5:
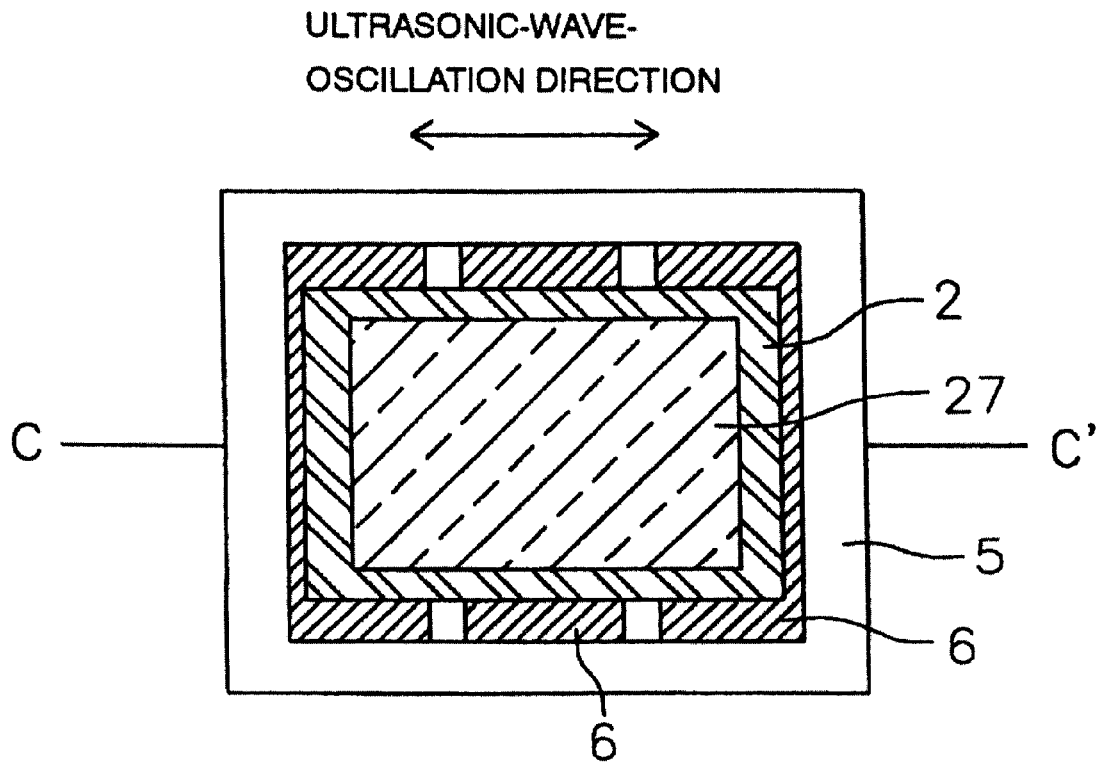
FIG. 5 is a top view of a method according to third preferred embodiment of the present invention used to package a surface acoustic wave device.
Figure 6:
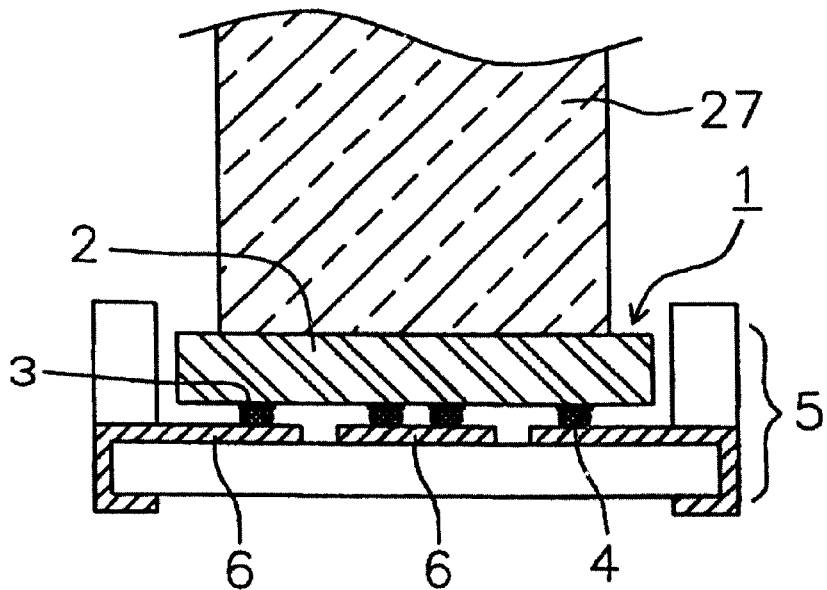
FIG. 6 is a cross-sectional view along line C–C' of FIG. 5.
Figure 7:
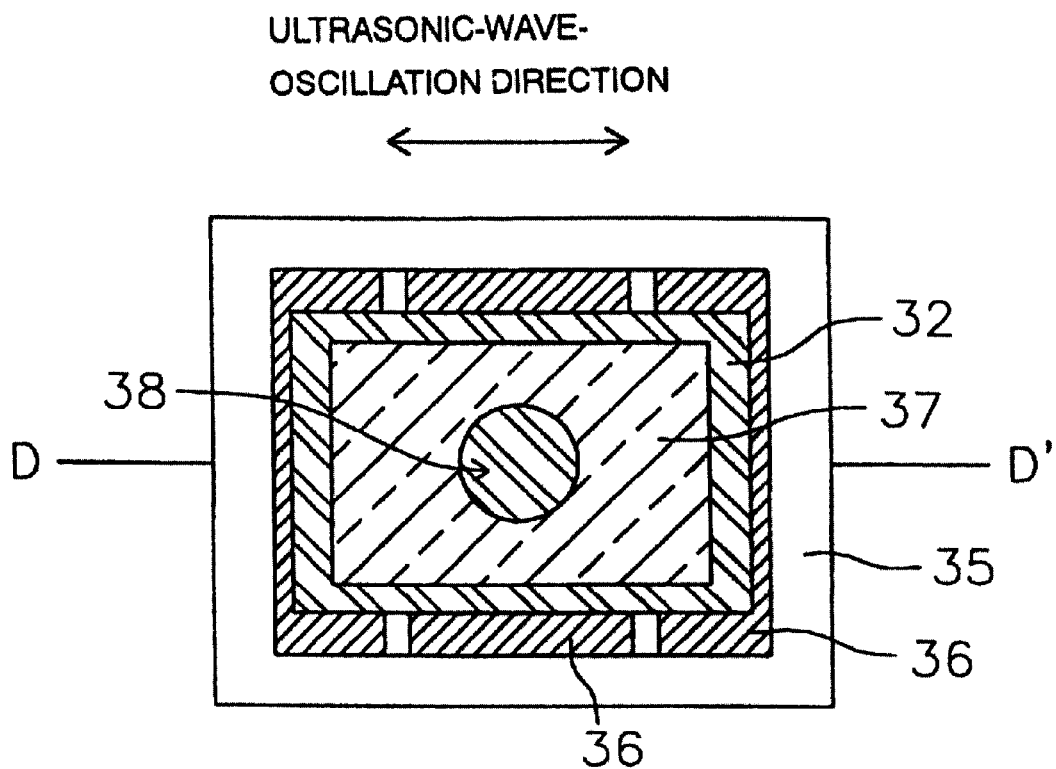
FIG. 7 is a top view of a method according to a fourth preferred embodiment of the present invention used to package a surface acoustic wave device.
Figure 8:
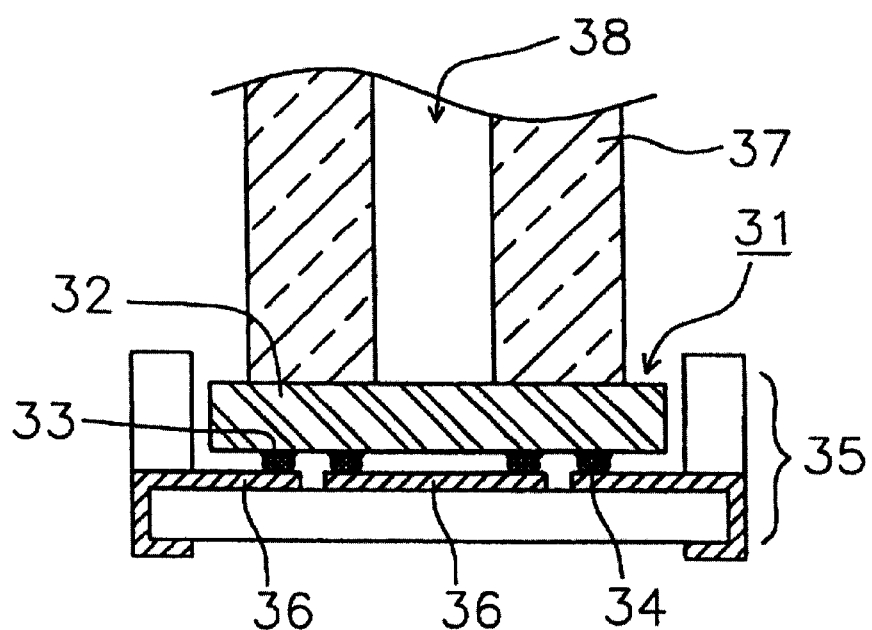
FIG. 8 is a cross-sectional view along line D–D' of FIG. 5.
Figure 9:
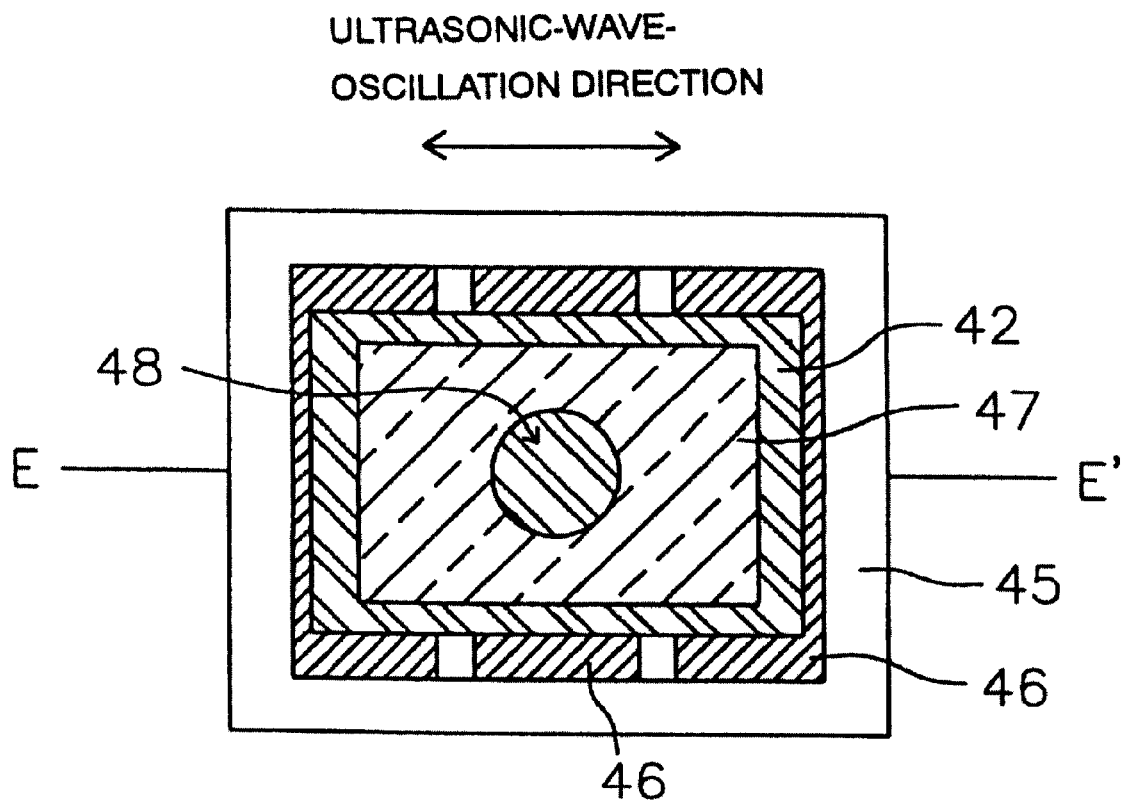
FIG. 9 is a top view of a comparative method that differs from preferred embodiments of the present invention used to package a surface acoustic wave device.
Figure 10:
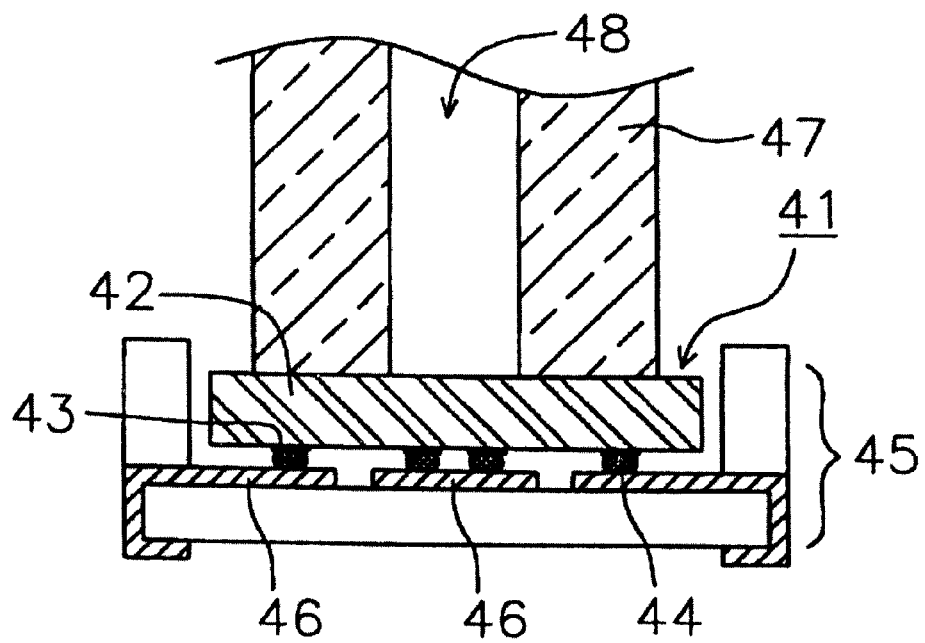
FIG. 10 is a cross-sectional view along line E–E' of FIG. 9.

FIGS. 1, 3, 5, 7, and 11 are top views of preferred embodiments of the present invention showing methods where the surface acoustic wave device is installed in a package. FIG. 9 is a top view of a comparative method where the surface acoustic wave device is installed in the package using a method that differs from a method according to a preferred embodiment of the present invention. FIG. 2 is a cross-sectional view along line A–A' of FIG. 1, FIG. 4 is a cross-sectional view along line B–B' of FIG. 3, FIG. 6 is a cross-sectional view along line C–C' of FIG. 5, FIG. 8 is a cross-sectional view along line D–D' of FIG. 7, FIG. 10 is a cross-sectional view along line E–E' of FIG. 9, and FIG. 12 is a cross-sectional view along line F–F' of FIG. 11.

As shown in FIGS. 1 and 2, a surface acoustic wave device 1 preferably includes a piezoelectric substrate 2 made of lithium tantalate, lithium niobate, quartz, or other suitable material; comb-shaped electrodes (not shown) preferably made of an Al thin film having a thickness of about 0.1 $\mu$m to about 0.2 $\mu$m and disposed on a surface of the piezoelectric substrate 2 (on a lower surface of the piezoelectric substrate 2 as seen in FIG. 2); and an electrode pad 3 electrically connected to the comb-shaped electrodes. Metals bumps 4 made of either an Au material or an alloy including an Au material, or other suitable material, are provided on the electrode pad 3.

A package 5 is preferably made of a ceramic material, such as $Al_2O_3$, or other suitable material, and electrode patterns 6 for electrically connecting the package 5 and the device 1 together are provided on an element-mounting substrate.

In addition, a bonding tool (collet) 7 has a pressing surface (a section of the boding tool 7, which is in contact with the device 1 as shown in FIG. 2) on its bottom portion. The pressing surface contacts a reverse surface of the surface acoustic wave device 1 (the upper surface of the piezoelectric substrate 2 as seen in FIG. 2) and presses it.

The surface acoustic wave device 1 is arranged so as to oppose electrode patterns 6 in the package 5 via the metal bumps 4. Next, when the pressing surface of the bonding tool 7 is in contact with the reverse surface of the surface acoustic wave device 1, an ultrasonic wave and a pressing force are applied to the bonding tool 7 thereby electrically connecting the metal bumps 4 to the electrode patterns 6. In this case, heat may also be applied together with the ultrasonic wave. The package 5 in which the surface acoustic wave device 1 is installed as described above is then hermetically sealed using a cap (not shown). As a result, the surface acoustic wave unit is completed.

Referring to FIGS. 1 and 2, a first preferred embodiment of the present invention is described. Where the maximum length of the reverse surface of the surface acoustic wave device 1 in the ultrasonic-wave direction is represented by $L_{chip}$, and the maximum length of the pressing surface of the bonding tool 7 in the ultrasonic-wave-oscillation direction is represented by $L_{tool}$, a relationship $L_{tool} > 0.5 \times L_{chip}$ is preferably satisfied. By increasing the length of the pressing surface of the bonding tool 7 in the ultrasonic-wave direction, the length of the surface acoustic wave device in contact with the bonding tool 7 in the oscillation direction of the surface acoustic wave device 1 is increased. At the time of packaging, even when a resultant force of the load and the ultrasonic wave is momentarily exerted on the surface acoustic wave device 1 in a slanting-down direction, the surface acoustic wave device 1 does not tilt with respect to the horizontal direction of the mounting substrate, nor does stress concentrate on metal bumps in specific positions in the electronic device element. Therefore, the number of occurrences of cracks on the metal bumps 4 and the electrode pad 3 is greatly reduced, thereby providing a stable connection between the package 5 and the surface acoustic wave device 1.

Figure 13:
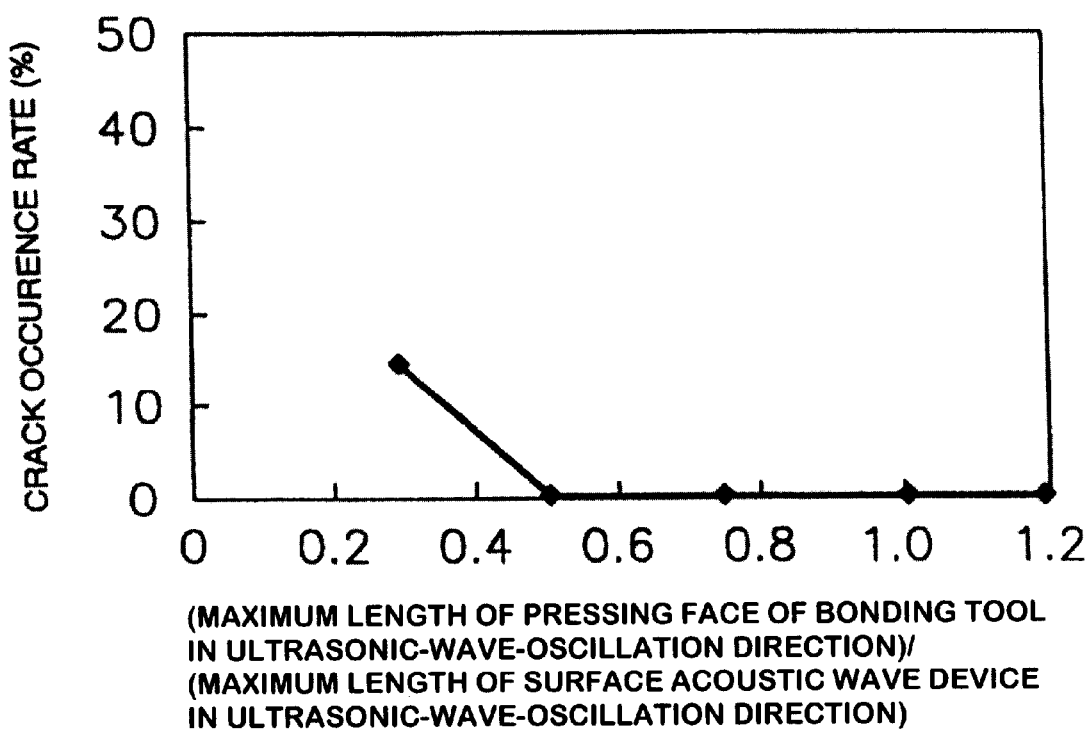
FIG. 13 is a graph showing relationships between the occurrence rates of cracks on a surface acoustic wave device and rates of the maximum length of a bonding tool in an ultrasonic-wave-oscillation direction and the maximum length of the surface acoustic wave device in an ultrasonic-wave-oscillation direction.
Figure 14A:
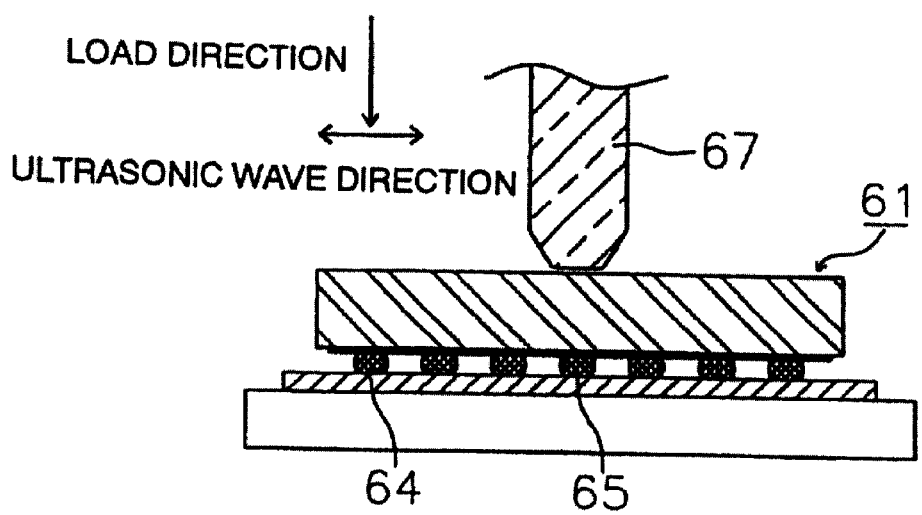
FIGS. 14A and 14B are cross-sectional views each showing a case where a conventional method is used to mount an electronic device element on a substrate.
Figure 14B:
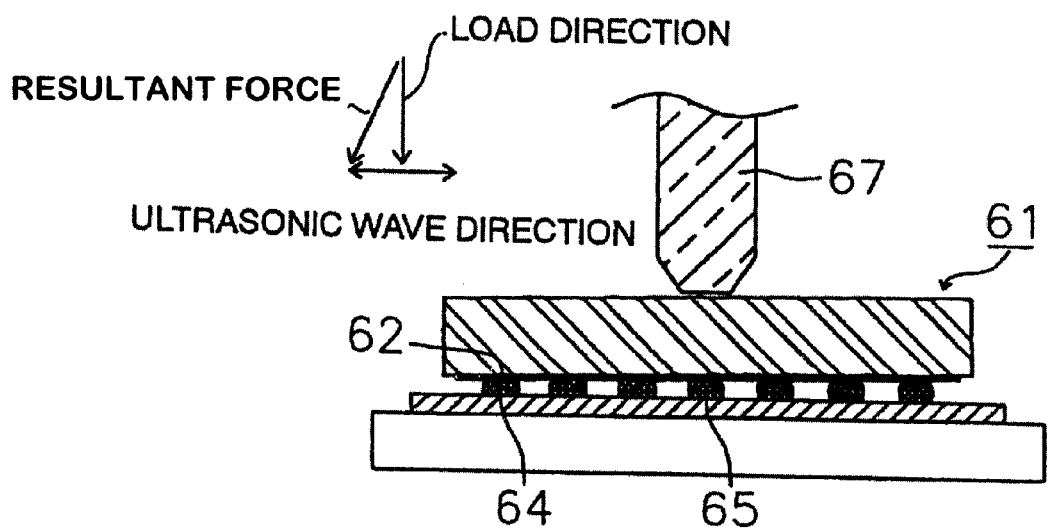
Figure 15:
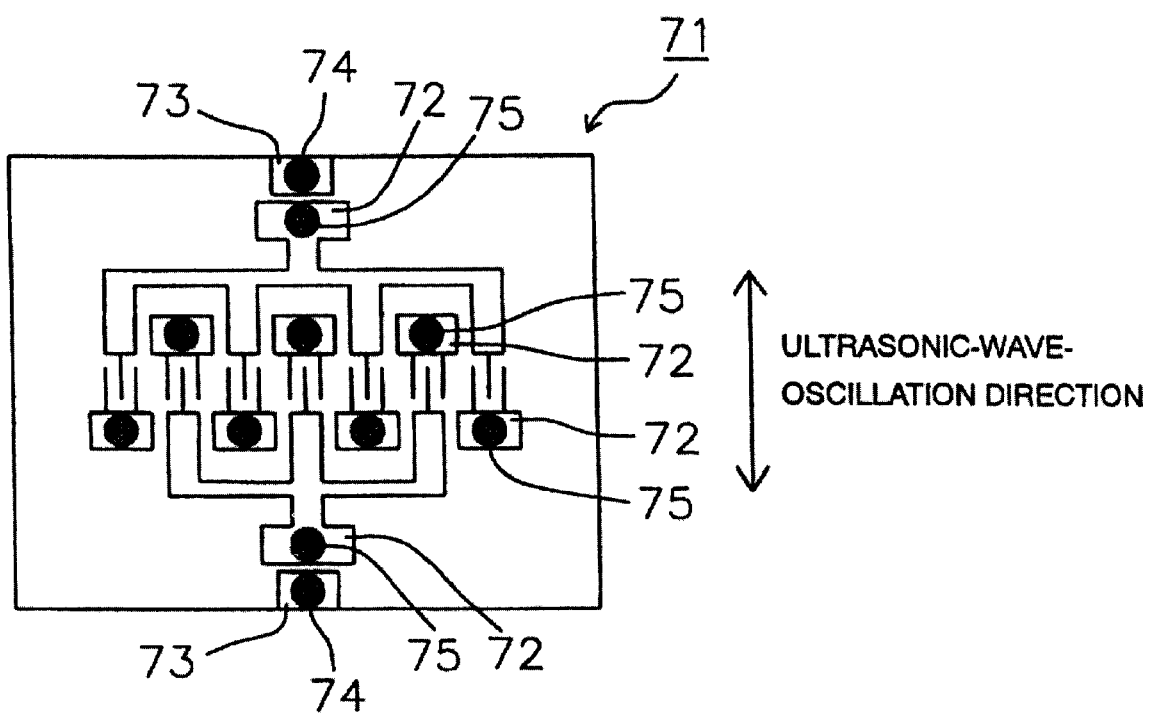
FIG. 15 is a top view of an electronic device element wherein dummy bumps are provided according to a conventional mounting method.

FIG. 13 shows the relationship between occurrence rates of cracks on the surface acoustic wave device and ratios of the maximum length of the bonding tool in the ultrasonic-wave-oscillation direction to the maximum length of the surface acoustic wave device in the ultrasonic-wave-oscillation direction. In the present preferred embodiment of the present invention, a tantalic-acid-lithium material is preferably used for the piezoelectric substrate, and the shape of the reverse surface of the bonding tool is preferably substantially circular. As illustrated in FIG. 13, the occurrence rates of cracks on the surface acoustic wave device are greatly reduced by using a bonding tool that satisfies the preferred condition of $L_{tool} > 0.5 \times L_{chip}$. In this preferred embodiment, the size of the bonding tool is determined so as to prevent interference with the inner wall of the package.

In FIGS. 1 and 2, the pressing surface of the bonding tool 7 is preferably substantially circular. However, the pressing surface may have either a four-sided shape or a two-direction-forked shape. With a pressing surface forked in two directions via a slit that is substantially perpendicular to the ultrasonic-wave-oscillation direction, the maximum length of a pressing surface in the ultrasonic-wave-oscillation direction, $L_{tool}$, includes the space defined by the central slit.

FIGS. 3 and 4 describe a second preferred embodiment of the present invention. The shape of a pressing surface of a bonding tool 17 is substantially the same as the shape of a reverse surface of a surface acoustic wave device 1.

Thus, configuring the pressing surface of the bonding tool 17 to have substantially the same shape as the reverse surface of the surface acoustic wave device 1, the surface acoustic wave device 1 has a length in contact with the bonding tool 17 that is increased in directions other than the ultrasonic-wave-oscillation direction. Thus, the surface acoustic wave device has an increased area in contact with the bonding tool 17 to provide stable contact therebetween. Thereby, stress is not concentrated on metal bumps in specific positions in the element. As a result, the number of occurrences of cracks on metal bumps 4 and an electrode pad 3 is greatly reduced, thereby providing even more stable coupling of the surface acoustic wave device to the package 5.

Further, when the shape of the pressing surface of the bonding tool 17 is substantially the same as the shape of the reverse surface of the surface acoustic wave device, the surface acoustic wave device 1 has the length in contact the boding tool 17, which is substantially increased in directions other than the ultrasonic-wave-oscillation direction. This results in stable connection between the surface acoustic wave device 1 and a package 5. In addition, as shown in FIG. 4, where the depth of the package 5 is greater than the height of the surface acoustic wave device 1, when the size of the pressing surface of the bonding tool 17 is greater than the size of the reverse surface of the surface acoustic wave device 1, since the bonding tool 17 can easily interfere with the inner wall of the package 5 when the ultrasonic wave is applied, the size of the package 5 must be larger than the size of the surface acoustic wave device 1. However, in the present preferred embodiment, where the shape of the pressing surface of the bonding tool 17 is substantially the same as the shape of the reverse surface of the surface acoustic wave device 1, the size of the package 5 does not have to be increased to prevent interference of the boding tool 17, thereby allowing miniaturization of the surface acoustic wave unit.

Referring to FIGS. 5 and 6, a third preferred embodiment of the present invention is described. In the present preferred embodiment, the maximum length of a pressing surface of a bonding tool 27 in the ultrasonic-wave-oscillation direction is about 0.8 times the maximum length of a reverse surface of a surface acoustic wave device 1 in the ultrasonic-wave-oscillation direction.

By setting the length of the pressing surface of the bonding tool 27 in the ultrasonic-wave-oscillation direction to be shorter than the length of the reverse surface of the surface acoustic wave device 1 in the ultrasonic-wave-oscillation direction, where the depth of a package is greater than the height of the surface acoustic wave device 1, even when the pressing surface of the bonding tool 27 deviates from the reverse surface of the surface acoustic wave device 1, there is a small distance between the periphery of the pressing surface of the bonding tool 27 and the periphery of the reverse surface of the element 1. Therefore, interference between the bonding tool 27 and a package 5 is prevented. Therefore, the size of the package 5 need not be increased, thereby allowing for miniaturization of the surface acoustic wave unit.

In the present preferred embodiment, when the maximum length of the pressing surface of the bonding tool 27 in the ultrasonic-wave-oscillation direction is about 0.8 times the maximum length of the reverse surface of the surface acoustic wave device 1 in the ultrasonic-wave-oscillation direction, the length of the pressing surface of the bonding tool 27 in the ultrasonic-wave-oscillation direction is sufficient such that the surface acoustic wave device 1 does not tilt with respect to the horizontal direction of the mounting substrate. In addition, with the aforementioned length, when the pressing surface of the bonding tool 27 deviates from the reverse surface of the surface acoustic wave device 1, the bonding tool 27 does not interfere with the sidewall of the package 5.

Referring to FIGS. 7 and 8, the fourth preferred embodiment of the present invention is described. In the present preferred embodiment, a vacuum opening 38 is provided on a pressing surface of a bonding tool 37 to provide a suction force to a surface acoustic wave device 31. The vacuum opening 38 is positioned in a portion of a reverse surface of the surface acoustic wave device 31 where a metal bump 34 is not located. Thus, the suction force is applied to the surface acoustic wave device 31, and the surface acoustic wave device 31 is included in a package 35.

Thus, the vacuum opening 38 enables the bonding tool 37 to pick up and transfer the surface acoustic wave device 31 and to position the surface acoustic wave device 31 on a corresponding electrode pattern 36 on the package 35. Also, in the surface acoustic wave device 31, an ultrasonic wave power that is applied to portions positioned directly under the vacuum opening 38 is less than applied to portions where the pressing surface is in contact with the surface acoustic wave device 31. Therefore, by arranging the vacuum opening 38 so as to be positioned on the reverse surface of a portion where the metal bump 34 of the surface acoustic wave device 31 is not located, the ultrasonic wave power which is exerted on individual metal bumps 34 is uniform. In this preferred embodiment, stress is not concentrated on metal bumps 34 at specific positions. Therefore, the number of occurrences of cracks on the metal bumps 34 and an electrode pad 33 is greatly reduced, thereby allowing stable and very reliable coupling of the surface acoustic wave device 31 to the package Table 1 illustrates crack occurrence rates when the bonding tool (in FIGS. 7 and 8) of preferred embodiments of the present invention is used and when a bonding tool 47 (comparative example) provided with a vacuum opening 48 shown in FIGS. 9 and 10 which is positioned on a reverse surface of a portion of the surface acoustic wave device where a metal bump 44 is located. From Table 1, it is apparent that the structure of the present preferred embodiment of the bonding tool 37 (FIG. 8) is effective to reduce the crack-occurrence rate.

TABLE 1

|  | The vacuum opening is positioned on the reverse surface of the portion where the metal bump is not located. (Preferred Embodiment 4) | The vacuum opening is positioned on the reverse surface of the portion where the metal bump is located. (Comparative example) |
| --- | --- | --- |
| Crack-occurrence rate | 0 (%) | 3 (%) |

Figure 11:
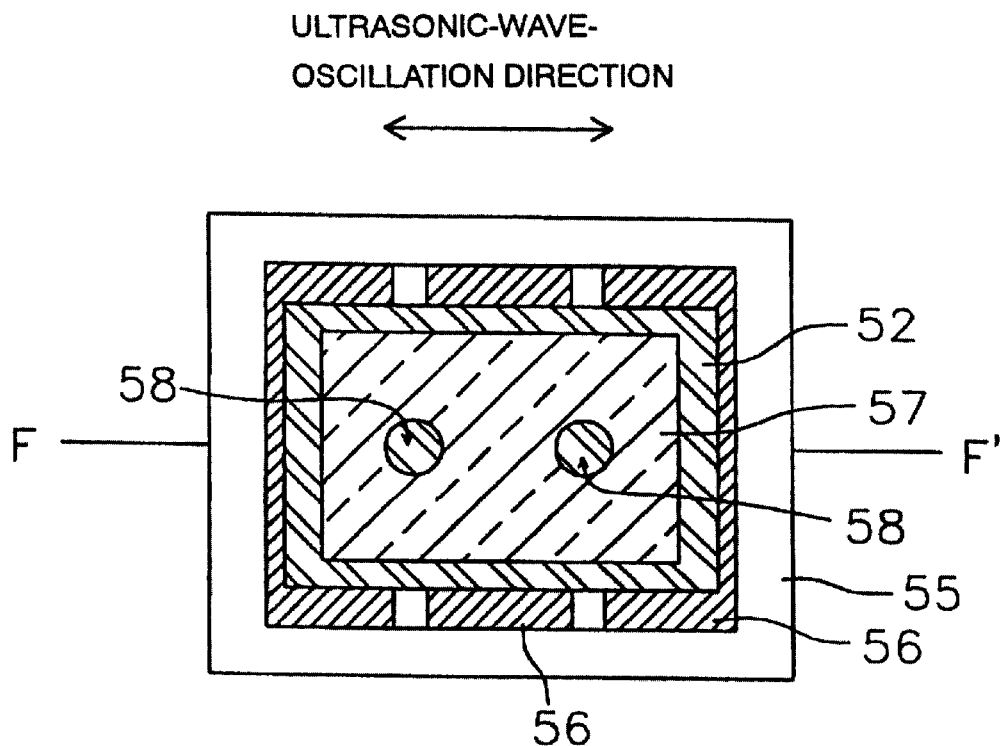
FIG. 11 is a top view of a method according to a fifth preferred embodiment of the present invention used to package a surface acoustic wave device.
Figure 12:
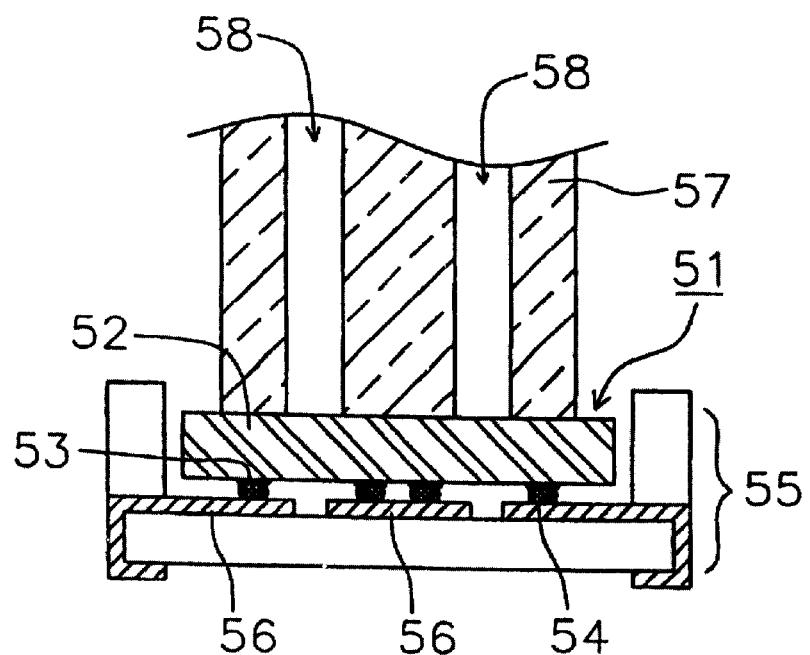
FIG. 12 is a cross-sectional view along line F–F' of FIG. 11.

Referring to FIGS. 11 and 12, a fifth preferred embodiment of the present invention is described. Similar to the fourth preferred embodiment, in the present preferred embodiment, vacuum openings 58 are provided on a pressing surface of a bonding tool 57. The vacuum openings 58 are positioned on portions of a reverse surface of the surface acoustic wave device 51 where metal bumps 54 are not located when the vacuum openings provide a suction force to a surface acoustic wave device 51. In the surface acoustic wave device 51 in which the is a small distance between the metal bumps 54, and the area where the metal bumps 54 are not located is small, as in the present preferred embodiment, a plurality of the vacuum openings 58, each of which is somewhat smaller, is provided in the bonding tool 57, thereby providing a secure vacuum force.

In each of the above-described preferred embodiments, a description has been provided of preferred embodiments in which the surface acoustic wave device is used as the electronic device element. This is because the present invention is particularly advantageous for packaging the surface acoustic wave device. That is, in the surface acoustic wave device, since a space that allows surface waves to be generated and freely propagated must be provided on the side of a functional surface of the device, the device cannot be immobilized by providing an adhesive between the device and a package. Therefore, metal bumps must be used to both electrically and mechanically couple the device and the package. For this reason, the metal bumps are required to have a high coupling strength and reliability.

Also, in each of the above-described preferred embodiments, a description has been given of the case where the metal bumps provided on the electrodes of the surface acoustic wave device is connected to the electrode patterns on the package. However, the present invention may be similarly used in a case where metal bumps are provided on electrode patterns on a package.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of mounting an electronic device element, comprising the steps of:
   providing the electronic device element having metal bumps located on a surface thereof;
   providing a bonding tool having a pressing surface in which a vacuum opening to apply a suction force to the electronic device element is provided on the pressing surface of the bonding tool;
   providing a mounting substrate;
   positioning the vacuum opening on the reverse surface of the electronic device element at a location where no metal bumps of the electronic device element are located when the vacuum opening applies the suction force to the electronic device element;
   keeping the pressing surface of the bonding tool in contact with a reverse surface of the electronic device element; and
   applying an ultrasonic wave to the bonding tool, thereby mounting the electronic device element on the mounting substrate; wherein
   a maximum length of the pressing surface of the bonding tool in the ultrasonic-wave-oscillation direction is at least approximately 0.5 times a maximum length of the reverse surface of the electronic device element in the ultrasonic-wave-oscillation direction.

2. The method according to claim 1, wherein a shape of the pressing surface of the bonding tool is substantially the same as a shape of the reverse surface of the electronic device element.

3. The method according to claim 1, further including the step of applying heat to the bonding tool in addition to applying the ultrasonic wave.

4. The method according to claim 1, wherein the maximum length of the pressing surface of the bonding tool in the ultrasonic-wave-oscillation direction is substantially equal to or shorter than the maximum length of the reverse surface of the electronic device element in the ultrasonic-wave-oscillation direction.

5. The method according to claim 1, wherein the maximum length of the pressing surface of the bonding tool in the ultrasonic-wave-oscillation direction is approximately 0.8 times the maximum length of the reverse surface of the electronic device element in the ultrasonic-wave-oscillation direction.

6. A method according to claim 1, wherein a second vacuum opening to apply a suction force to the electronic device element is provided on the pressing surface of the bonding tool, further including the steps of positioning the second vacuum opening on the reverse surface of the electronic device element at a location where no metal bumps of the electronic device element are located when the vacuum opening applies the suction force to the electronic device element.

7. The method according to claim 1, wherein said bonding tool has a substantially circular shape.

8. The method according to claim 1, wherein said bonding tool has a substantially rectangular shape.

9. The method according to claim 1, wherein the electronic device element is a surface acoustic wave device.

10. A method for mounting an electronic device element on a mounting substrate comprising:
    providing a bonding tool having a pressing surface to contact a reverse surface of the electronic device element having metal bumps located on a surface thereof, in which a vacuum opening to apply a suction force to the electronic device element is provided on the pressing surface of the bonding tool;
    positioning the vacuum opening on the reverse surface of the electronic device element at a location where no metal bumps of the electronic device element are provided when the vacuum opening applies the suction force to the electronic device element;
    placing the electronic device element on the mounting substrate; and
    applying an ultrasonic wave to the bonding tool thereby mounting said electronic device element on said mounting substrate; wherein
    a maximum length of the pressing surface of the bonding tool in the ultrasonic-wave-oscillation direction is at least about 0.5 times a maximum length of the reverse surface of the electronic device element in the ultrasonic-wave-oscillation direction.

11. The method according to claim 10, further including the step of applying heat to the bonding tool in addition to applying the ultrasonic wave.

12. The method according to claim 10, wherein a shape of the pressing surface of the bonding tool is substantially the same as a shape of the reverse surface of the electronic device element.

13. The according to claim 10, wherein the maximum length of the pressing surface of the bonding tool in the ultrasonic-wave-oscillation direction is substantially equal to or shorter than the maximum length of the reverse surface of the electronic device element in the ultrasonic-wave-oscillation direction.

14. The method according to claim 10, wherein the maximum length of the pressing surface of the bonding tool in the ultrasonic-wave-oscillation direction is approximately 0.8 times the maximum length of the reverse surface of the electronic device element in the ultrasonic-wave-oscillation direction.

15. The method according to claim 10, wherein a second vacuum opening to apply a suction force to the electronic device element is provided on the pressing surface of the bonding tool, further comprising the step of positioning the second vacuum opening on the reverse surface of the electronic device element at a location where no metal bumps of the electronic device element are provided when the vacuum opening applies the suction force to the electronic device element.

16. The method according to claim 10, wherein the electronic device element is a surface acoustic wave device.

17. A method of manufacturing a surface acoustic wave unit comprising the steps of:

using the mounting method according to claim 16 to package a surface acoustic wave device into a package; and closing the package using a cap.

18. A method of manufacturing a surface acoustic wave unit comprising the steps of:

providing a surface acoustic wave unit having metal bumps located on a surface thereof;

providing a bonding tool having a pressing surface;

providing a mounting substrate;

providing a package having side walls;

installing the surface acoustic wave unit and the mounting substrate in the package;

keeping the pressing surface of the bonding tool in contact with a reverse surface of the surface acoustic wave unit;

applying an ultrasonic wave to the bonding tool such that the bonding tool does not interfere with the side wells of the package, thereby mounting the surface acoustic wave unit on the mounting substrate; and closing the package using a cap; wherein a maximum length of the pressing surface of the bonding tool in the ultrasonic-wave-oscillation direction is at least approximately 0.5 times a maximum length of the reverse surface of the surface acoustic wave unit in the ultrasonic-wave-oscillation direction.

* * * * *